United States Patent
Friedman et al.

(10) Patent No.: US 9,240,789 B2
(45) Date of Patent: Jan. 19, 2016

(54) SUB-RATE LOW-SWING DATA RECEIVER

(75) Inventors: Daniel J. Friedman, Sleepy Hollow, NY (US); Yong Liu, Rye, NY (US); Jose A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 802 days.

(21) Appl. No.: 13/600,534

(22) Filed: Aug. 31, 2012

(65) Prior Publication Data

US 2015/0303920 A1 Oct. 22, 2015

(51) Int. Cl.
*H03K 19/0175* (2006.01)
*H03K 19/0185* (2006.01)

(52) U.S. Cl.
CPC ............... *H03K 19/018521* (2013.01)

(58) Field of Classification Search
CPC ... H03K 19/018521; G11C 7/067; G05F 3/24
USPC .......................... 326/63, 68, 80–81; 327/333
See application file for complete search history.

(56) References Cited

U.S. PATENT DOCUMENTS

| | | | |
|---|---|---|---|
| 7,116,594 B2 * | 10/2006 | Luk et al. | 365/205 |
| 8,410,816 B1 * | 4/2013 | Liu et al. | 326/81 |
| 8,629,705 B2 * | 1/2014 | Chang et al. | 327/333 |
| 2005/0145895 A1 * | 7/2005 | Luk et al. | 257/288 |
| 2008/0116949 A1 | 5/2008 | Nair | |
| 2008/0272952 A1 | 11/2008 | Wood | |
| 2009/0108925 A1 | 4/2009 | Tang et al. | |
| 2010/0164539 A1 | 7/2010 | Balamurugan et al. | |
| 2010/0329390 A1 | 12/2010 | Chow et al. | |

FOREIGN PATENT DOCUMENTS

WO 98/40973 A1 9/1998

OTHER PUBLICATIONS

D. Schinkel et al., "Low-Power, High-Speed Transceivers for Network-on-Chip Communication," IEEE Transactions on Very Large Scale Integration (VLSI) Systems, Jan. 2009, pp. 12-21, vol. 17, No. 1.
Y. Liu et al., "A Compact Low-Power 3D I/O in 45nm CMOS," IEEE International Solid-State Circuits Conference (ISSCC), Feb. 2012, pp. 21-23.
U.S. Appl. No. 13/370,144, filed in the name of Y. Liu et al. Feb. 9, 2012 and entitled "Low-Swing Signaling Scheme for Data Communication.".

* cited by examiner

*Primary Examiner* — Jason M Crawford
(74) *Attorney, Agent, or Firm* — Anne V. Dougherty; Ryan, Mason & Lewis, LLP (57) ABSTRACT

A receiver is adapted to receive an input signal having a first voltage swing and to generate an output signal having a second voltage swing, the output signal being indicative of the input signal, the second voltage swing being greater than the first voltage swing. The receiver includes a first sub-rate receiver block and at least a second sub-rate receiver block. A receiver clock is divided into a first sub-rate clock phase and at least a second sub-rate clock phase, the first sub-rate clock phase being used to drive the first sub-rate receiver block and the second sub-rate clock phase being used to drive the second sub-rate receiver block. Each of the first sub-rate receiver block and the second sub-rate receiver block includes at least one gated-diode sense amplifier.

20 Claims, 6 Drawing Sheets

SUB-RATE LOW-SWING DATA RECEIVER

This invention was made with Government support under Contract No.: HR0011-09-C-0002 (Defense Advanced Research Projects Agency (DARPA)). The Government has certain rights in this invention.

FIELD

The present application relates to data processing and communication systems and, more particularly, data receivers used in such systems.

BACKGROUND

In on-chip and inter-chip data communication systems where high data bandwidth is required, power dissipation and chip area of input/output (I/O) circuits are crucial design factors to be considered. For instance, modern multi-core microprocessors have thousands of bits of on-chip data buses connecting processor cores and caches. In high-performance servers, the inter-chip links from processors to network switches or off-chip caches also require I/O buses hundreds of bits wide running at multiple Gb/s per lane data rates. Compact and low-power I/O schemes are needed for these high-performance systems.

SUMMARY

Embodiments of the invention provide improved receiver architectures. For example, embodiments of the invention provide a sub-rate compact low-swing receiver based on a gated-diode sense amplifier. This sub-rate receiver improves the data rate of the compact low-swing signaling scheme incorporating a gated-diode sense amplifier.

For example, in one embodiment, a receiver is adapted to receive an input signal having a first voltage swing and to generate an output signal having a second voltage swing, the output signal being indicative of the input signal, the second voltage swing being greater than the first voltage swing. The receiver comprises a first sub-rate receiver block and at least a second sub-rate receiver block. A receiver clock is divided into a first sub-rate clock phase and at least a second sub-rate clock phase, the first sub-rate clock phase being used to drive the first sub-rate receiver block and the second sub-rate clock phase being used to drive the second sub-rate receiver block. Each of the first sub-rate receiver block and the second sub-rate receiver block comprises at least one gated-diode sense amplifier.

Further, one of the first sub-rate receiver block and the second sub-rate receiver block are preferably configured to disconnect from the input signal when the other of the first sub-rate receiver block and the second sub-rate receiver block is connected to the input signal.

In one example, each gated-diode sense amplifier comprises: a first transistor of a first conductivity type, the first transistor having a first source/drain adapted for connection with a first voltage supply, a gate adapted for receiving a first clock signal, and a second source/drain; a second transistor of a second conductivity type, the second transistor having a first source/drain, a second source/drain connected to the second source/drain of the first transistor and forming a first output of the sense amplifier, and a gate adapted for connection with a capacitive element; and a third transistor of a second conductivity type, the third transistor having a first source/drain adapted for connection with a second voltage supply, a second source/drain connected to the first source/drain of the second transistor, and a gate adapted for receiving a second clock signal. The gated-diode sense amplifier also comprises a switching circuit operative to selectively couple the input signal with the gate of the second transistor as a function of a control signal, the control signal being indicative of a voltage generated at the first output of the sense amplifier. The sense amplifier is operative in a first mode to store charge in the capacitive element, and is operative in a second mode to impart a voltage on the gate of the second transistor which is indicative of the charge stored in the capacitive element.

Further, in this example, each gated-diode sense amplifier further comprises an isolation transistor operative to disconnect the given sub-rate receiver block from the input signal during the second mode.

Advantageously, illustrative embodiments of the invention provide a low-swing signaling scheme and circuits that incorporate a compact low-power receiver with high sensitivity based on gated-diode sensing in a sub-rate receiver architecture.

These and other features, objects and advantages of the present invention will become apparent from the following detailed description of illustrative embodiments thereof, which is to be read in connection with the accompanying drawings.

DETAILED DESCRIPTION

Embodiments of the present invention will be described herein in the context of illustrative apparatus (e.g., receivers, transmitters, interconnections, etc.) and methods incorporating a sub-rate low-swing receiver suitable for use in, for example, a data communication system. The term "voltage swing," or simply "swing," as used herein is intended to refer to the peak-to-peak output voltage level of a device or circuit. The term "low-swing" is intended to refer broadly to a peak-to-peak output voltage which is much less than prescribed levels (typically, the supply voltage in I/O circuits). It is to be appreciated, however, that embodiments of the invention are not limited to the specific apparatus and methods illustratively shown and described herein; nor are embodiments of the invention limited to a data communication system application. Rather, embodiments of the invention are directed more broadly to sub-rate low-swing receiver techniques for beneficially reducing undesired data interaction among multiple sub-rate receivers and for improving timing of clock signals in each sub-rate receiver to optimize the I/O performance. Moreover, it will become apparent to those skilled in the art given the teachings herein that numerous modifications can be made to the embodiments shown that are within the scope of the present invention. That is, no limitations with respect to the specific embodiments described herein are intended or should be inferred.

It is to be further understood that circuit descriptions are given below with occasional reference to specific terminals (nodes), e.g., input, output, first, second, return, gate, source, drain, etc., by which a given component is coupled to one or more other components. However, given the functional description herein of each of the components, and their interaction with one another also described in detail herein, one of ordinary skill in the art will realize how each component could be alternatively coupled (i.e., in comparison to what is shown and described in the context of the figures) in order to realize one or more advantages of embodiments of the invention. Also, it is to be understood that a transistor terminal designated as a source may function as a drain, and vice versa, depending on how the transistor is connected in the circuit.

Also, "PMOS" with regard to transistors refers to positive type (p-type) metal oxide semiconductor transistors, while "NMOS" refers to negative type (n-type) metal oxide semiconductor transistors. However, it is to be understood that embodiments of the invention are not limited to these particular types of transistors.

Prior to describing various illustrative embodiments of the invention, we describe problems addressed by embodiments of the invention. We then describe various solutions in accordance with illustrative embodiments of the invention in the context of FIGS. 1 through 9.

A low-swing signaling scheme based on a gated-diode sense-amplifier receiver has been proposed by International Business Machines Corporation (Armonk, N.Y.) as described in U.S. patent application Ser. No. 13/370,144 filed on Feb. 9, 2012 and entitled "Low-Swing Signaling Scheme for Data Communication," the disclosure of which is incorporated herein in its entirety. In such a low-swing signaling scheme, the low-swing receiver based on a gated-diode sense amplifier circuit has very high signal sensitivity. Due to its effective signal amplification approach and simple circuit topology, the receiver is very power and area efficient. Furthermore, the gated-diode sense/amplifier receiver handles single-ended signaling which, compared to differential signaling approaches, approximately doubles the data bandwidth supportable in the same wiring space (in certain cases, single-ended signaling may require space for signal shielding to improve the signal integrity).

However, like most receivers, the speed of the low-swing receiver based on a gated-diode sense amplifier is limited due to its timing requirement (or, effectively, set-up time and hold time of the receiver sampling and evaluation circuit). It is realized herein that a sub-rate receiver architecture can improve the receiver data rate. In such an architecture, the receiver clock is divided into multiple phases and each clock phase is used to drive one receiver block. The full-rate input data is sampled by these multiple sub-rate receivers and the sub-rate output data is processed in the sub-rate clock domain in most cases. In such a way, the sub-rate receiver can run at higher data rates than the full-rate receiver since each sub-rate receiver block has more timing margin (due to sub-rate clock). Thus, the timing requirement is mitigated.

To provide a low-swing receiver based on gated-diode sense amplifiers in a sub-rate receiver architecture, several issues had to be addressed. First, any undesired data interaction among multiple sub-rate receivers had to be avoided. Second, the timing of clock signals in each sub-rate receiver had to be designed to optimize the I/O performance. Embodiments of the invention as will be described in detail below solve, inter alia, these two issues.

We now turn to a description of illustrative embodiments that overcome the above and other problems.

Embodiments of the invention provide a sub-rate compact low-swing receiver based on a gated-diode sense amplifier. This sub-rate receiver improves the data rate of the compact low-swing signaling scheme incorporating a gated-diode sense amplifier.

The sub-rate low-swing receiver is composed of multiple sub-rate receiver blocks. Each sub-rate receiver block is based on a gated-diode sense amplifier. All of these sub-rate receiver blocks share the same input data port. The clocks of the sub-rate receiver blocks are generated from the same clock source and have multiple clock phases, thus the full-rate input data is sampled and processed by the sub-rate receiver blocks. Embodiments of the invention avoid undesired data interaction and improve the I/O performance.

The sub-rate receiver approach according to embodiments of the invention has several advantages compared with a full-rate receiver. First, by way of example, the sub-rate receiver approach relaxes the integrated circuit technology limit due to relaxed timing requirements. Furthermore, since the sub-rate clock is distributed to the receivers, the clocking circuit power can be less than the power in the full-rate clock distribution circuit. In addition, a half-rate receiver scheme (i.e., two sub-rate receiver blocks) is better suited for DDR (double data rate) memory operation.

Figure 1:
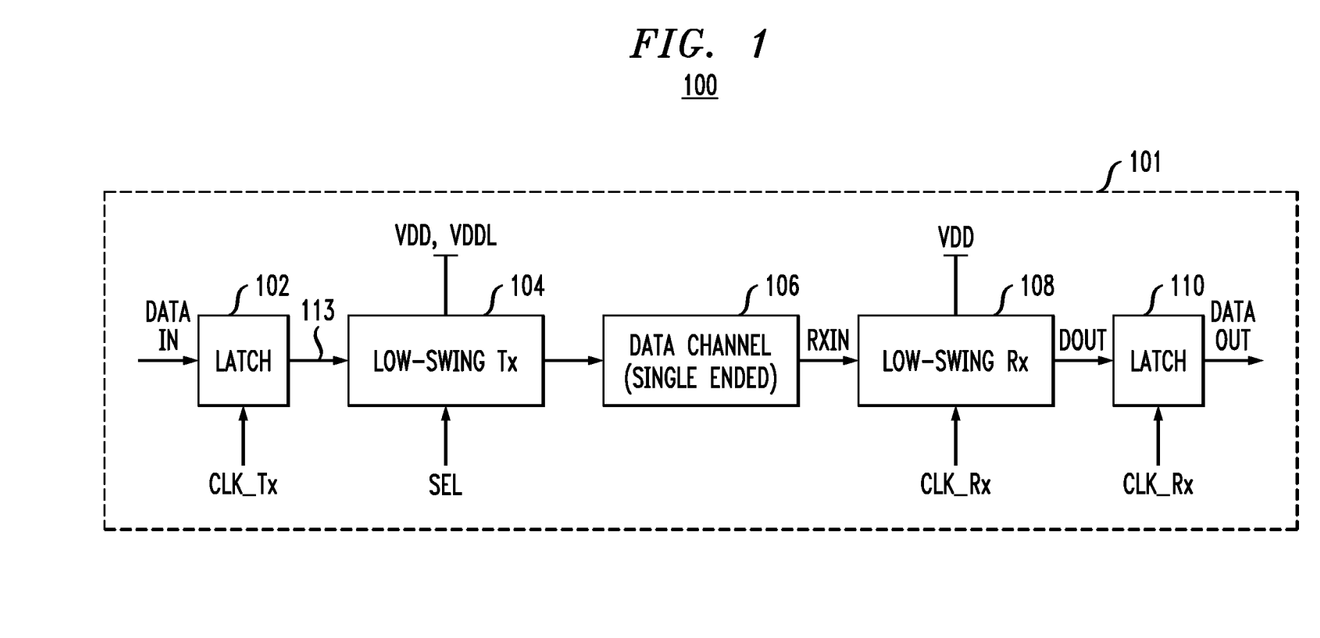
FIG. 1 illustrates a data communication system, according to an embodiment of the invention.

FIG. 1 illustrates a data communication system, according to an embodiment of the invention. As shown, data communication system 100 includes a data signal path 101. The signal path 101 in the system 100 comprises three primary components; namely, a low-swing transmitter, a low-swing receiver, and a communication channel established between the transmitter and receiver. That is, as shown, the signal path 101 includes a low-swing transmitter (Tx) 104, a low-swing receiver (Rx) 108, and a data channel 106, or alternative communication medium, established between the transmitter and receiver. Data channel 106 is shown as a single-ended channel, although one ordinarily skilled in the art will recognize that the data channel may be a differential channel, in alternative embodiments.

On the transmitter side of the channel, input data DATAIN provided to the signal path 101, in this embodiment, is retimed using a latch 102, or alternative synchronization circuitry, coupled in series with the input of the low-swing transmitter 104. The latch 102 is operative to receive a transmit clock signal, CLK_Tx, at a clock input thereof and to generate a retimed input data signal 113 at an output of the latch 102.

On the receiver side, output data DATAOUT generated by signal path 101, in this embodiment, is retimed using a latch circuit 110 coupled in series with an output of the low-swing receiver 108 in a manner consistent with that shown on the transmitter side. More particularly, an output signal DOUT generated by the low-swing receiver 108 in signal path 101 is supplied to a data input of a second latch 110. The latch 110 is operative to receive a receive clock signal, CLK_Rx, at a clock input thereof and to generate a retimed output data signal, DATAOUT, at an output of the latch 110. The receive clock signal CLK_Rx is preferably the same clock signal supplied to the low-swing receiver 108 so that the receiver 108 and latch 110 are synchronized. In some embodiments of the invention, the receive clock signal CLK_Rx can be the same as the transmit clock signal CLK_Tx, or have the same clock phase as CLK_Tx, when embodiments of the invention are applied to on-chip signaling or three-dimensional (3D) inter-chip I/O, where channel delay is less than one clock cycle. In other embodiments, the receive clock signal CLK_Rx can be derived from the received data or from a forwarded clock in the case of source synchronous buses.

The input data signal DATAIN may have full-swing voltage levels, having an amplitude of a first prescribed voltage, which may be voltage supply VDD (e.g., 1.0 volt). The low-swing transmitter 104 is operative to convert the full-swing voltage level (with amplitude VDD) to a reduced-swing (i.e., low-swing) signal, having an amplitude of a second prescribed voltage, which may be VDDL (e.g., 0.3 volt). It is to be understood that the invention is not limited to any specific voltage levels for VDD or VDDL, although it is intended that an absolute value of the full-swing voltage levels be greater than an absolute value of the reduced-swing (low-swing) voltage levels.

The reduced-swing signal generated by the low-swing transmitter 104, in the signal path 101, is communicated to low-swing receiver 108 via data channel 106. Data channel 106 may comprise one or more of various known transmission mediums, wired and/or wireless, including, but not limited to, on-chip wiring, off-chip silicon carrier channels, off-chip standard interconnect wiring, inter-chip interconnects in a three-dimensional (3D) chip stack, infrared, optical, etc. To save wiring area, single-ended signaling (shown) is desirable, but differential signaling can also be used in the context of embodiments of the invention, as will become apparent to those ordinarily skilled in the art given the teachings herein.

The reduced-swing signal conveyed by data channel 106 is received by the low-swing receiver 108. More particularly, the low-swing signal having a peak amplitude of VDDL generated by the low-swing transmitter 104 and communicated via data channel 106 is sensed and amplified to a full-swing signal having a peak amplitude of VDD by low-swing receiver 108.

Figure 2:
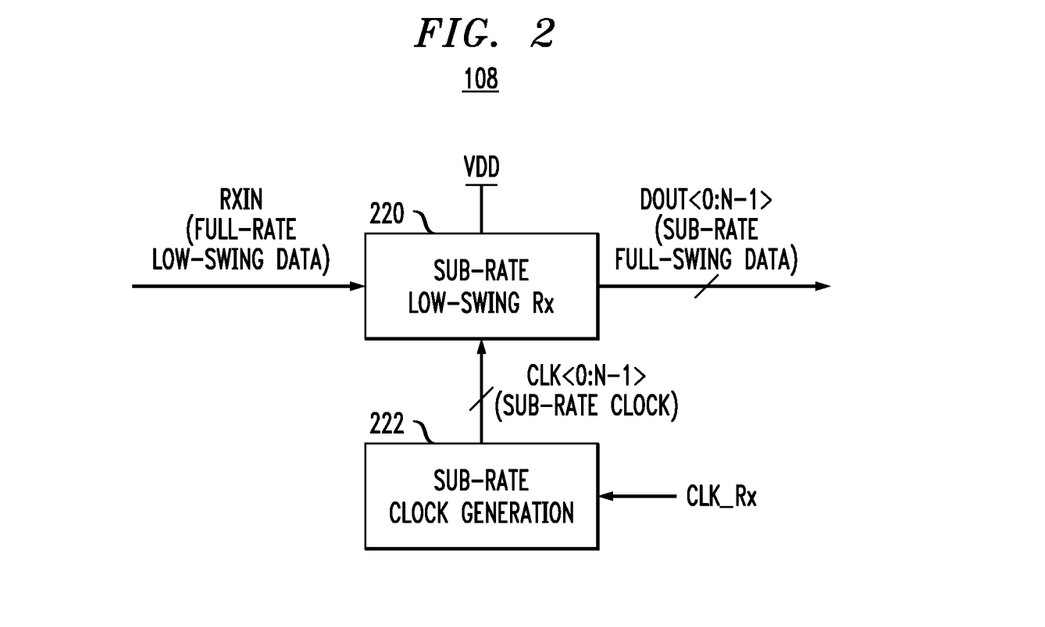
FIG. 2 illustrates a sub-rate low-swing receiver, according to an embodiment of the invention.

FIG. 2 illustrates a sub-rate low-swing receiver, according to an embodiment of the invention. More particularly, FIG. 2 illustrates low-swing receiver 108 shown in FIG. 1. Recall that full-rate low-swing data is sent from the data channel 106 to the low-swing receiver 108. Low-swing receiver 108 comprises sub-rate low-swing receiver 220, driven by a set of sub-rate clocks CLK<0:N−1>, where N is an integer number and equal to or larger than 2. CLK<0:N−1> may be generated by sub-rate clock generation circuit 222 from a clock source signal CLK_RX, which can be a full-rate clock, a half-rate clock, etc. After sampling and amplification by the sub-rate low-swing receiver 220, sub-rate full-swing data DOUT<0:N−1> is generated.

Figure 3:
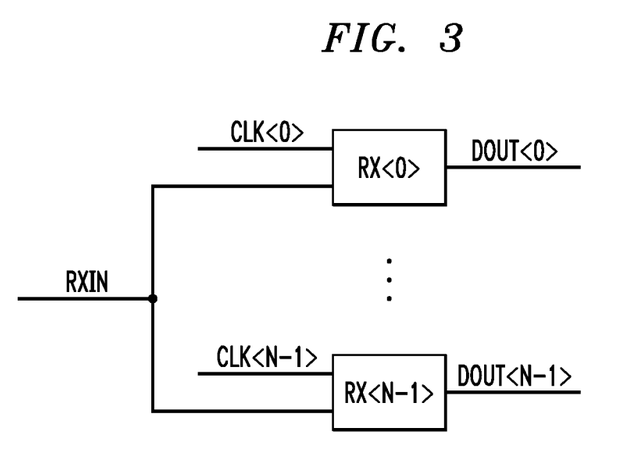
FIG. 3 illustrates an architecture of a sub-rate low-swing receiver, according to an embodiment of the invention.
Figure 4:
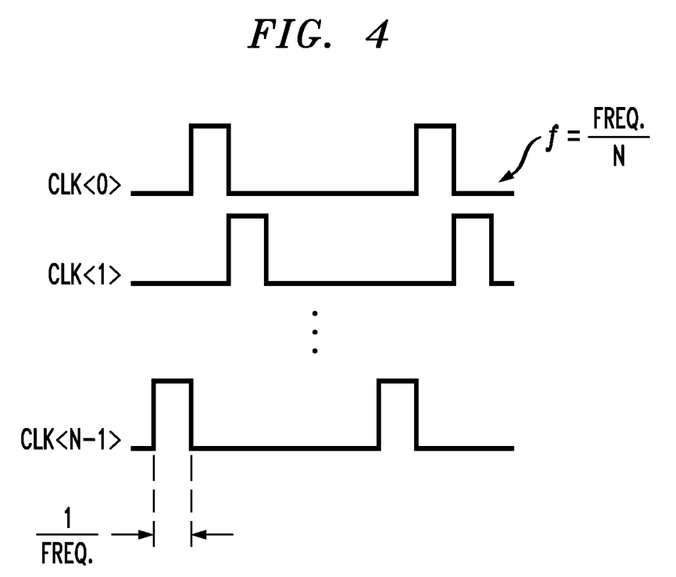
FIG. 4 illustrates clock waveforms associated with the sub-rate low-swing receiver illustrated in FIG. 3.

FIG. 3 illustrates an exemplary architecture of the sub-rate low-swing receiver 220 (of FIG. 2) while FIG. 4 illustrates the clock waveforms generated by the sub-rate clock generation circuit 222 and coupled to the sub-rate low-swing receiver 220. In this system, in total, there are N sub-rate receiver blocks RX<i> including sub-rate receiver blocks RX<0> to RX<N−1>, each of which is driven by a sub-rate clock signal CLK<0> to CLK<N−1> respectively. Each of the sub-rate clocks CLK<0:N−1> has a frequency of Freq/N, where Freq is the frequency of the full-rate clock or the data rate of the input data RXIN. Each of the sub-rate clocks CLK<0:N−1> is high only for one full-rate clock period, i.e., 1/Freq. When CLK<i> is high, the i_th receiver block is in a precharge and sampling mode. The input signal RXIN is sampled by the i_th receiver block. When CLK<i> changes from high to low, the i_th receiver block turns into data evaluation mode. It processes RXIN and generates timed output data DOUT<i>. Thus, the full-rate input data RXIN is processed by the sub-rate receivers, like a multiplexer in the time domain.

Figure 5:
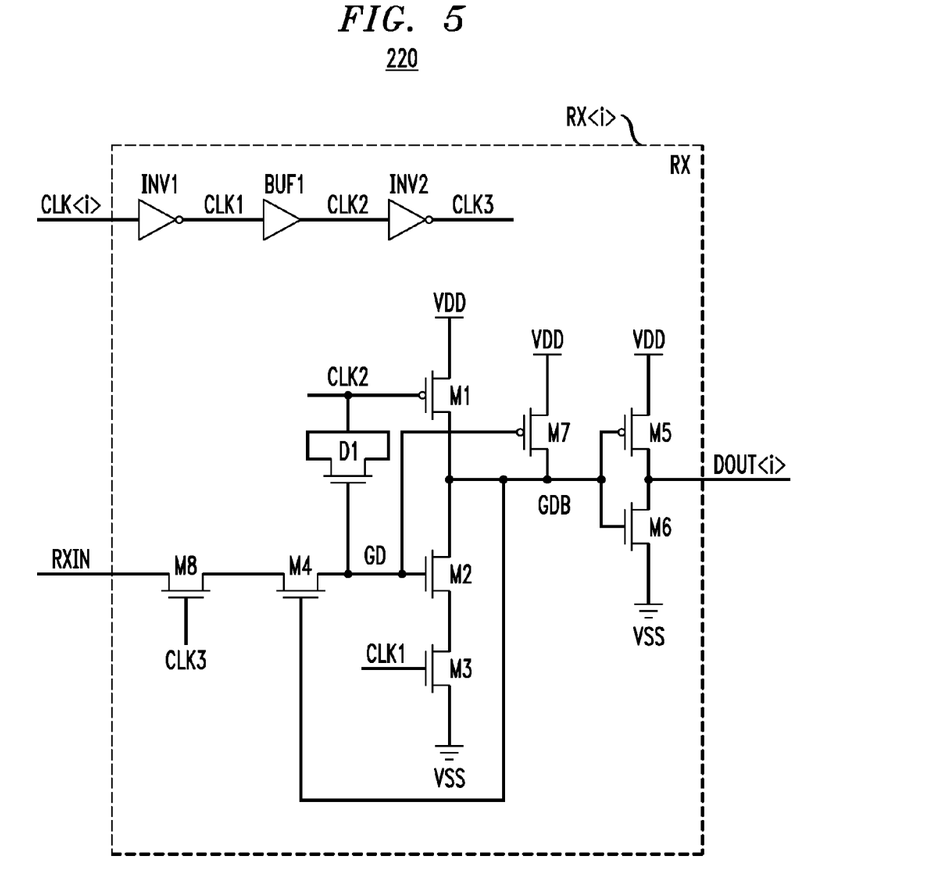
FIG. 5 illustrates a low-swing sub-rate receiver circuit based on a gated-diode sense amplifier, according to an embodiment of the invention.

With reference to FIG. 5, a schematic diagram depicts at least an exemplary low-swing receiver RX<i> of sub-rate low-swing receiver 220. Receiver RX<i> is based on a gated-diode sense amplifier with the addition of support for sub-rate receiver operation.

In the circuit of FIG. 5, three clock signals CLK1, CLK2 and CLK3 are generated from the CLK<i> input and used to drive different parts of the receiver. With reference to the timing diagram of FIG. 6, CLK1 is inverted and delayed from CLK<i> by INV1, CLK2 is buffered and delayed from CLK1 by buffer BUF1 and CLK3 is inverted and delayed from CLK2 by invertor INV2. Clocks CLK1, CLK2 and CLK3 are operative to control a precharge and sampling mode, and an evaluation mode of the sub-rate receiver block RX<i>.

The receiver RX<i> comprises a first transistor M1 of a first conductivity type (e.g. PMOS), a first transistor, M2, of a second conductivity type (e.g. NMOS), a second transistor, M3, of a second conductivity type (e.g. NMOS), a source of M1 adapted for connection with a first voltage supply, which in this embodiment is VDD, a gate of M1 adapted for receiving a first clock signal, CLK2, a drain of M1 connected with a drain of M2 at node GDB, a gate of M2 connected to node GD, a source of M2 connected to the drain of M3, a gate of M3 adapted for receiving a second clock signal, CLK1, and a source of M3 adapted for connection with a second voltage supply, which in this embodiment is VSS.

Receiver RX<i> further comprises a second transistor, M5, of a first conductivity type (e.g. PMOS) and a third transistor, M6, of a second conductivity type (e.g. NMOS), a source of M5 adapted for connection with the first voltage supply, a drain of M5 connected to the drain of M6 and to output node DOUT<i>, a source of M6 adapted for connection with the second voltage supply, and a gate of M5 connected to the gate of M6 and to node GDB. Receiver RX<1> further comprises a fourth transistor, M8, of a second conductivity type (e.g. NMOS), a fifth transistor, M4, of a second conductivity type (e.g. NMOS), a source of M8 adapted for receiving a low-swing data input signal, RXIN, a gate of M8 connected to a third clock signal, CLK3, a drain of M8 connected to the source of M4, a drain of M4 connected to node GD, and a gate of M4 connected to node GDB. A sixth transistor, D1, of a second conductivity type (e.g. NMOS), or an alternative capacitive element, is coupled between the gate of transistor M1 and the gate of transistor M2. Specifically, a drain and a source of transistor D1 are connected with the gate of transistor M1, and a gate of D1 is connected with the gate of transistor M2 at node GD. Transistor D1 is thus said to be connected in a gated-diode configuration, operative for signal amplification. Finally, receiver RX<i> comprises a third transistor, M7, of a first conductivity type (e.g. PMOS), a source of M7 adapted for connection with the first voltage supply, a gate of M7 connected to node GD, and a drain of M7 connected to node GDB.

Although the source and drain of transistor D1 are shown as being connected together, it is to be appreciated that for gated-diode operation, it is sufficient to connect only the source or the drain; that is, one of either the source or the drain of D1 may be left unconnected (i.e., open) and the transistor device operated as a two-terminal device, according to other embodiments. This implementation has an advantage of a smaller layout area for the gated diode, without adverse effects, especially for gated-diode dimensions below a certain gate length.

Furthermore, it is to be appreciated that, because a metal-oxide-semiconductor (MOS) device is symmetrical in nature, and thus bidirectional, the assignment of source and drain designations in the MOS device is essentially arbitrary. Therefore, the source and drain may be referred to herein generally as first and second source/drain, respectively, where "source/drain" in this context denotes a source or a drain.

In terms of operation, the low-swing receiver RX<i> operates in at least two distinct phases (i.e., modes); namely a precharge and sampling phase and an evaluation phase. In the precharge and sampling phase, the clock signal CLK<i> is a high logic level (e.g., VDD). With clock signal CLK<i> high, signal CLK1 and CLK2 will be at a low logic level (e.g., VSS), and signal CLK3 will be at a high logic level (e.g., VDD). With signal CLK2 low, transistor M1 turns on, thereby pulling node GDB high, and thereby setting output signal DOUT<i> low via the output inverter formed by transistors M5 and M6. Signal CLK1 is low thereby keeping transistor M3 turned off, preventing current from flowing from the first voltage supply to the second voltage supply through transistor M1. With signal CLK3 high, transistor M8 is turned on, connecting low-swing input signal RXIN to the source of transistor M4. Since the gate of transistor M4 is connected to node GDB, node GDB currently being pulled high, transistor M4 is turned on thereby completing the connection of low-swing input signal RXIN to the gate of transistor M2 at node GD. Regardless of the voltage level at node GD, transistor M2 will not enable current to flow between the first voltage supply and the second voltage supply since transistor M3 is turned off. Therefore, while signal CLK<i> is high, node GDB is precharged to a high level (i.e., VDD), and the input signal RXIN is sampled at node GD.

Figure 6:
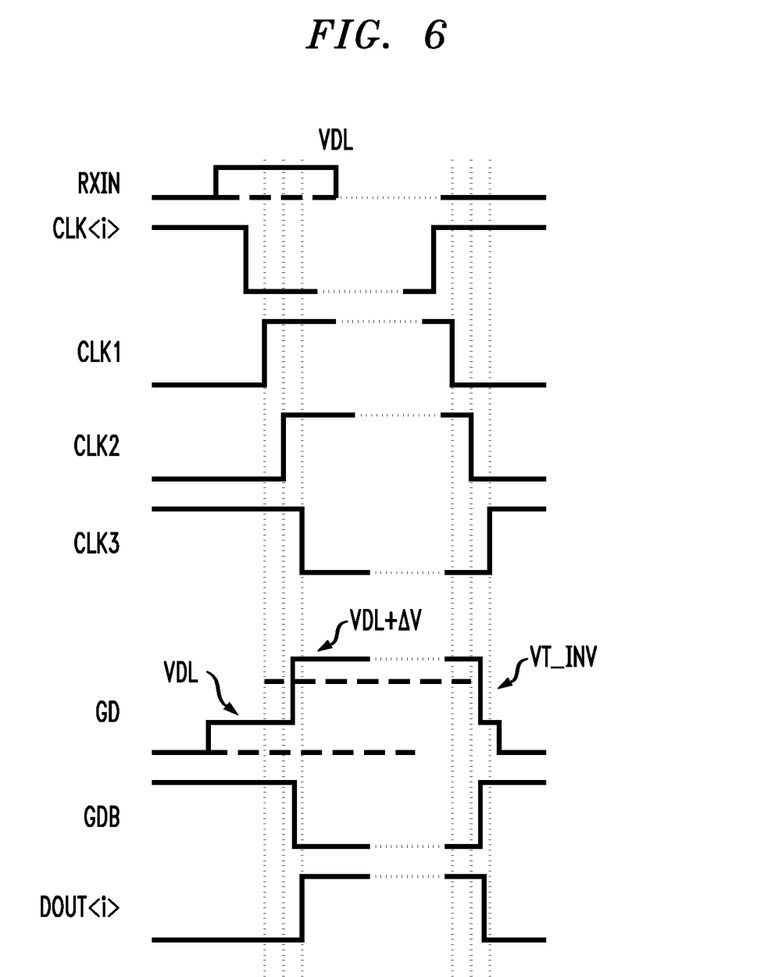
FIG. 6 illustrates clock and related signal waveforms for the low-swing sub-rate receiver circuit of FIG. 5.

In the evaluation phase, the clock signal CLK<i> goes low resulting in clock signals CLK1 and CLK2 going high and clock signal CLK3 going low. The rising of clock signal CLK2 will be at least partially coupled to node GD through the gated-diode transistor D1. As shown in FIG. 6, the voltage of the signal GD (at the gate of D1) will be VDL or 0 (depending on whether the input data bit is 1 or 0) plus some incremental voltage, $\Delta V$, coupled through D1. The level of the voltage $\Delta V$ will be a function of an effective gate-to-source capacitance of D1, $C_{D1}$; the larger the value of $C_{D1}$, the larger the voltage $\Delta V$. $C_{D1}$ is a non-linear capacitor whose capacitance value is determined as a function of the gate-to-source voltage and the threshold voltage of the gated diode D1. Note that $C_{D1}$ will vary depending on the initial state of node GD. Specifically, when the voltage on node GD is low (e.g., 0), or otherwise below the threshold voltage of the gated diode D1, D1 will be turned off and $C_{D1}$ will be indicative of a parasitic capacitance of node GD (determined by the parasitic coupling between the gate and the source regions of the gated diode), which is a very small value (e.g., less than one femtofarad (fF)).

During the evaluation phase, CLK3 goes low turning off transistor M8. Transistor M8 functions as an input signal (RXIN) isolation switch connecting the receiver block RX<i> to the input signal RXIN: when CLK3 is high, the receiver block is connected to signal RXIN and when CLK3 is low, the receiver is disconnected from signal RXIN. In such a way, at any CLK<i> time, only one receiver block out of N receiver blocks is connected to the input signal RXIN and the others are disconnected from RXIN. In this way, the undesired interaction from one receiver block to another is removed.

As illustrated in the waveforms of FIG. 6, when CLK<i> goes from high to low, CLK1 goes from low to high after a delay through invertor INV1. CLK2 then goes high after a delay through buffer BUF1, and CLK3 goes low after a delay through invertor INV2. CLK1 going high turns on transistor M3, allowing node GDB to be discharged to the second voltage supply (e.g., VSS) if the voltage at node GD exceeds a threshold required to turn on transistor M2. CLK2 goes high turning off precharge transistor M1 and coupling a voltage $\Delta V$, through transistor D1, onto node GD. The coupled voltage, $\Delta V$, onto node GD insures that a low-swing logic high voltage level of input signal RXIN is sufficiently high enough to exceed the threshold voltage level, VT_INV, of the invertor formed by pull-up transistor M7 and pull-down transistors M2 and M3. As illustrated in FIG. 6, a voltage level of VDL, stored on node GD prior to CLK2 going high is insufficient to turn on transistor M2, since the level of VDL does not exceed the required threshold level of VT_INV. As CLK2 goes high, voltage $\Delta V$ is coupled onto node GD by transistor D1, increasing the voltage at node GD to VDL+$\Delta V$, thereby exceeding the required threshold voltage VT_INV. When the voltage at node GD exceeds the required threshold voltage, node GDB will be discharged through transistors M2 and M3, and the output signal DOUT<i> will go to a high level (i.e., VDD).

During the evaluation phase, if the input signal RXIN, sampled at node GD, was a low level (i.e., 0 or VSS), the coupled voltage, $\Delta V$, is small. Thus, transistor M2 will remain off, node GDB will remain at VDD and output DOUT<i> will remain low (i.e., 0 or VSS). Transistor M7 is a weak pull-up transistor that helps maintain the voltage level of node GDB at VDD when node GD is below the threshold level VT_INV during the evaluation mode of the receiver.

Figure 7:
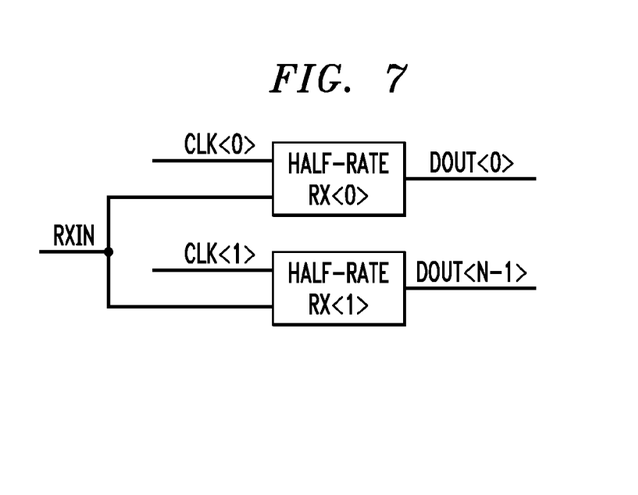
FIG. 7 illustrates an architecture of a half-rate low-swing receiver, according to an embodiment of the invention.
Figure 8:
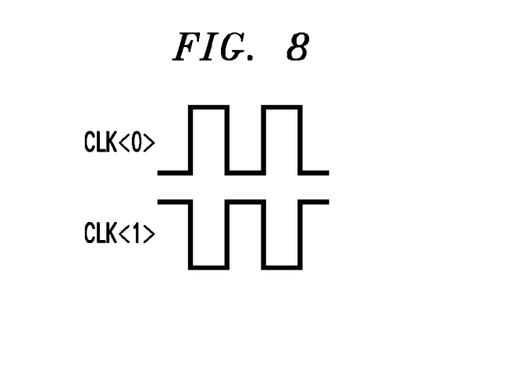
FIG. 8 illustrates clock waveforms associated with the half-rate low-swing receiver illustrated in FIG. 7.

FIG. 7 shows an exemplary half-rate low-swing receiver circuit, i.e., a sub-rate low-swing receiver of FIG. 4 in which N=2. In this case, there are two half-rate low-swing receiver blocks, RX<0> and RX<1> driven by complimentary half-rate clocks, CLK<0> and CLK<1> respectively. As illustrated in FIG. 8, CLK<0> is the complement of CLK<1>. When CLK<0> is high and CLK<1> is low, low-swing receiver RX<0> is in the precharge and sampling phase, wherein node GDB of receiver RX<0> is precharged to VDD through transistor M1 and wherein node GD is coupled to low-swing input signal RXIN through transistors M8 and M4.

The proposed clock timing for the low-swing receiver is as follows: first, when CLK<0> changes from low to high, CLK1 transitions from high to low, which turns off the tail transistor M3. Next, CLK2 transitions from high to low to precharge node GDB. Finally, CLK3 transitions from low to high to connect the low-swing receiver to the channel to sample the low-swing input signal RXIN.

Though this proposed clock timing optimizes the performance of the sub-rate low-swing receiver, other clock timing approaches are also contemplated.

While CLK<1> is low, low-swing receiver RX<1> is in the evaluation phase wherein transistor M8 is turned off, thereby disconnecting low-swing input signal RXIN from receiver RX<1>. In RX<1>, the voltage level at node GD after CLK<1> goes low and CLK2, internal to RX<1>, goes high, will be VDL+$\Delta V$ or $\Delta V$, where $\Delta V$ depends on the initial voltage level at node GD. If the voltage at node GD exceeds the threshold voltage VT_INV of the inverter formed by transistors M2, M3 and M7, node GDB will be discharged through transistors M2 and M3 to the second voltage supply (i.e., 0 or VSS) and the output DOUT<1> will go high (i.e., VDD). If the voltage at node GD does not exceed the threshold voltage VT_INV, node GDB will remain high (i.e., VDD) through weak pullup transistor M7. In this example, output DOUT<1> will remain low (i.e., 0 or VSS).

Again referring to FIGS. 5, 7 and 8, when CLK<0> is low and CLK<1> is high, low-swing receiver RX<0> will be in the evaluation phase while low-swing receiver RX<1> will be in the precharge and sampling phase. In this example, low-swing input signal RXIN will be coupled to node GD of RX<1> through transistors M8 and M4, and node GDB of RX<1> will be precharged to VDD through transistor M1 of RX<1>. The low-swing input signal RXIN will be disconnected from low-swing receiver RX<0> avoiding any undesired data interaction between receivers RX<0> and RX<1>.

While a transistor of one conductivity type (e.g., NMOS) may be shown in the figures, it is to be appreciated that a transistor of a complementary conductivity type (e.g., PMOS) may be used in substitution therefor, with little or no change in functionality, with or without modification of the circuit, as will be understood by those ordinarily skilled in the art. For example, an NMOS device operating as a switch can be replaced by a functionally equivalent PMOS device by inverting the logic signal driving a gate of the device.

Figure 9:
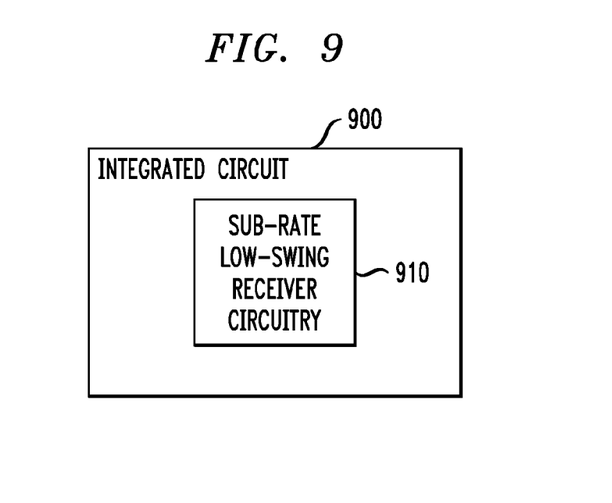
FIG. 9 illustrates an integrated circuit comprising a sub-rate low-swing receiver circuit, according to an embodiment of the invention.

As shown in FIG. 9, one or more embodiments of the invention may be implemented in an integrated circuit. More particularly, sub-rate low-swing receiver circuitry 910 (e.g., receiver circuitry as described herein in the context of FIGS. 1-8) is shown as being implemented as part of integrated circuit 900. Of course, receiver circuitry described herein could be implemented on more than one integrated circuit.

In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One ordinarily skilled in the art would know how to dice wafers and package die to produce integrated circuits. Integrated circuits so manufactured are considered part of this invention.

An integrated circuit in accordance with embodiments of the invention can be employed in essentially any data communication application and/or electronic system. Suitable systems for implementing embodiments of the invention may include, but are not limited to, data communication systems, networking systems, I/O interface circuitry, etc. Systems incorporating such integrated circuits are considered part of one or more embodiments of the invention. Given the teachings provided herein, one of ordinary skill in the art will be able to contemplate other implementations and applications.

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A receiver adapted to receive an input signal having a first voltage swing and to generate an output signal having a second voltage swing, the output signal being indicative of the input signal, the second voltage swing being greater than the first voltage swing, the receiver comprising:
    a first sub-rate receiver block; and
    at least a second sub-rate receiver block,
    wherein a receiver clock is divided into a first sub-rate clock phase and at least a second sub-rate clock phase, the first sub-rate clock phase being used to drive the first sub-rate receiver block and the second sub-rate clock phase being used to drive the second sub-rate receiver block; and
    further wherein each of the first sub-rate receiver block and the second sub-rate receiver block comprises at least one gated-diode sense amplifier.

2. The receiver of claim 1, wherein one of the first sub-rate receiver block and the second sub-rate receiver block is configured to disconnect from the input signal when the other of the first sub-rate receiver block and the second sub-rate receiver block is connected to the input signal.

3. The receiver of claim 1, wherein each gated-diode sense amplifier comprises:
    a first transistor of a first conductivity type, the first transistor having a first source/drain adapted for connection with a first voltage supply, a gate adapted for receiving a first clock signal, and a second source/drain;
    a second transistor of a second conductivity type, the second transistor having a first source/drain, a second source/drain connected to the second source/drain of the first transistor and forming a first output of the sense amplifier, and a gate adapted for connection with a capacitive element;
    a third transistor of a second conductivity type, the third transistor having a first source/drain adapted for connection with a second voltage supply, a second source/drain connected to the first source/drain of the second transistor, and a gate adapted for receiving a second clock signal; and
    a switching circuit operative to selectively couple the input signal with the gate of the second transistor as a function of a control signal, the control signal being indicative of a voltage generated at the first output of the sense amplifier;
    wherein the sense amplifier is operative in a first mode to store charge in the capacitive element, and is operative in a second mode to impart a voltage on the gate of the second transistor which is indicative of the charge stored in the capacitive element.

4. The receiver of claim 3, wherein each gated-diode sense amplifier further comprises an isolation circuit operative to disconnect the given sub-rate receiver block from the input signal during the second mode.

5. The receiver of claim 4, wherein the switching circuit comprises a fourth transistor of a second conductivity type, the fourth transistor having a first source/drain connected with the gate of the second transistor and the capacitive element, a second source/drain adapted for connection with the input signal, and a gate adapted for connection with the control signal indicative of a voltage generated at the first output of the sense amplifier.

6. The receiver of claim 5, wherein the isolation circuit comprises a fifth transistor of a second conductivity type, the fifth transistor having a first source/drain connected with the second source/drain of the fourth transistor, a second source/drain adapted for connection with the input signal, and a gate adapted for receiving a third clock signal.

7. The receiver of claim 6, wherein the first, second and third clock signals are derived from the first sub-rate clock phase in the first sub-rate receiver block and from the second sub-rate clock phase in the second sub-rate receiver block.

8. The receiver of claim 7, wherein the second clock signal is an inverted version of the given sub-rate clock phase.

9. The receiver of claim 8, wherein the first clock signal is a buffered version of the second clock signal.

10. The receiver of claim 9, wherein the third clock signal is an inverted version of the first clock signal.

11. The receiver of claim 6, wherein the capacitive element comprises a sixth transistor of a second conductivity type having a first source/drain and a second source/drain adapted for connection with the second clock signal, and a gate connected with the gate of the second transistor.

12. The receiver of claim 11, wherein the capacitive element has a capacitance associated therewith that varies as a function of at least one of the second clock signal and the input signal.

13. The receiver of claim 1, wherein the at least one sense amplifier further comprises an output stage connected with the first output, the output stage being operative to generate the output signal of the receiver as a function of the signal generated at the first output.

14. The receiver of claim 1, wherein the receiver is operative for usage as part of one of a data communication system, a networking system, and an input/output interface circuit.

15. An integrated circuit, comprising:
   a receiver adapted to receive an input signal having a first voltage swing and to generate an output signal having a second voltage swing, the output signal being indicative of the input signal, the second voltage swing being greater than the first voltage swing, the receiver comprising:
   a first sub-rate receiver block; and
   at least a second sub-rate receiver block,
   wherein a receiver clock is divided into a first sub-rate clock phase and at least a second sub-rate clock phase, the first sub-rate clock phase being used to drive the first sub-rate receiver block and the second sub-rate clock phase being used to drive the second sub-rate receiver block; and
   further wherein each of the first sub-rate receiver block and the second sub-rate receiver block comprises at least one gated-diode sense amplifier.

16. The integrated circuit of claim 15, wherein one of the first sub-rate receiver block and the second sub-rate receiver block is configured to disconnect from the input signal when the other of the first sub-rate receiver block and the second sub-rate receiver block is connected to the input signal.

17. The integrated circuit of claim 15, wherein each gated-diode sense amplifier comprises:

a first transistor of a first conductivity type, the first transistor having a first source/drain adapted for connection with a first voltage supply, a gate adapted for receiving a first clock signal, and a second source/drain;

a second transistor of a second conductivity type, the second transistor having a first source/drain, a second source/drain connected to the second source/drain of the first transistor and forming a first output of the sense amplifier, and a gate adapted for connection with a capacitive element;

a third transistor of a second conductivity type, the third transistor having a first source/drain adapted for connection with a second voltage supply, a second source/drain connected to the first source/drain of the second transistor, and a gate adapted for receiving a second clock signal; and a switching circuit operative to selectively couple the input signal with the gate of the second transistor as a function of a control signal, the control signal being indicative of a voltage generated at the first output of the sense amplifier;

wherein the sense amplifier is operative in a first mode to store charge in the capacitive element, and is operative in a second mode to impart a voltage on the gate of the second transistor which is indicative of the charge stored in the capacitive element.

18. The integrated circuit of claim 17, wherein each gated-diode sense amplifier further comprises an isolation circuit operative to disconnect the given sub-rate receiver block from the input signal during the second mode, the isolation circuit further operative to be responsive to a third clock signal.

19. The integrated circuit of claim 18, wherein the first, second and third clock signals are derived from the first sub-rate clock phase in the first sub-rate receiver block and from the second sub-rate clock phase in the second sub-rate receiver block.

20. The integrated circuit of claim 19, wherein the second clock signal is an inverted version of the given sub-rate clock phase, the first clock signal is a buffered version of the second clock signal, and the third clock signal is an inverted version of the first clock signal.

* * * * *